United States Patent

Ham

[11] 4,015,279
[45] Mar. 29, 1977

[54] EDGELESS TRANSISTOR

[75] Inventor: William Edward Ham, Mercerville, N.J.

[73] Assignee: RCA Corporation, New York, N.Y.

[22] Filed: May 27, 1975

[21] Appl. No.: 581,042

[52] U.S. Cl. .................................. 357/23; 357/4; 357/41; 357/49; 357/52; 357/56

[51] Int. Cl.² .................. H01L 27/12; H01L 29/78

[58] Field of Search ............. 357/4, 23, 41, 42, 56, 357/52, 49

[56] References Cited

UNITED STATES PATENTS

| | | | |
|---|---|---|---|
| 3,840,888 | 10/1974 | Gaensslen et al. | 357/42 |
| 3,890,632 | 6/1975 | Ham et al. | 357/23 |
| 3,898,684 | 8/1975 | Davidsohn | 357/41 |

Primary Examiner—William D. Larkins
Attorney, Agent, or Firm—H. Christoffersen; R. P. Williams; W. L. Muckelroy

[57] ABSTRACT

An MOS mesa transistor wherein the sidewalls of the mesa are electrically isolated from a device formed on the principal surface of the mesa, is provided. The mesa is comprised of a source and a drain which do not extend to a sidewall of the mesa. The source and the drain are surrounded by a band of semiconductor material which is a portion of the mesa and which electrically isolates the source and the drain from the sidewalls of the mesa.

10 Claims, 6 Drawing Figures

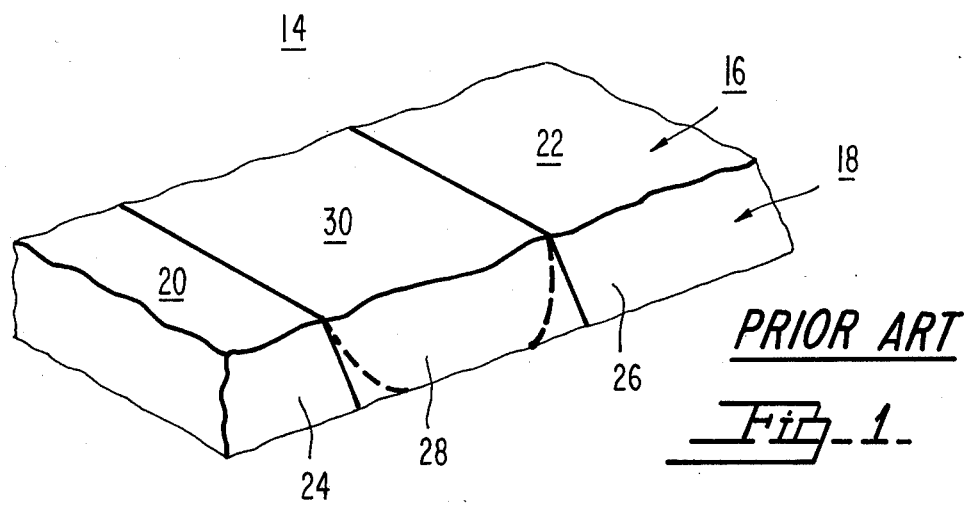
PRIOR ART
*Fig_1_*
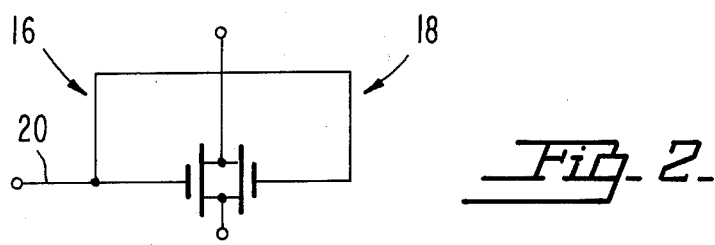
*Fig_2_*
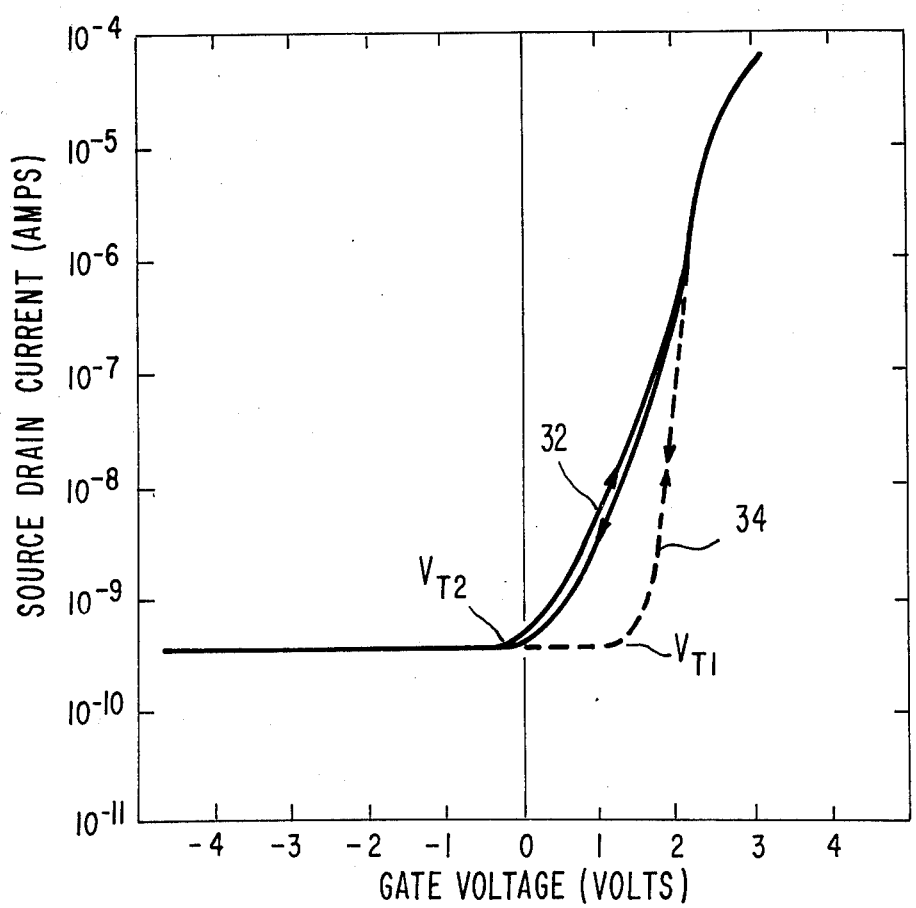
*Fig_3_*

EDGELESS TRANSISTOR

This invention is generally related to the art which encompasses metal-oxide-semiconductor (MOS) structured transistors made on semiconductor islands.

The invention is specifically related to methods for eliminating edge (sidewall) effects in MOS mesa transistor structures and more specifically to methods for reducing the leakage current in these structures as well as the structure produced by the use of these methods.

The boundary between the edge and the principal surface of the island is referred to herein as the top periphery of the island. The boundary between the edge and the substrate is referred to herein as the bottom periphery of the island.

Certain anomalous effects in the characteristics of both N channel and P channel MOS transistors occur when the source and drain diffusions contact an edge of the semiconductor island and a portion of the gate electrode which extends down this edge of the island onto the substrate has portions of the source and drain regions adjacent to it. For example, in a usual MOS/-SOS, i.e., metal-oxide-semiconductor/silicon-on-sapphire device, a silicon island (mesa) is formed on a sapphire substrate and an insulating layer of silicon dioxide is formed adjacent the island and the substrate. The island has sloping sidewalls which form what is known as the edge of the island. In the manufacture of the device, the source and drain regions are defined by apertures etched in a masking layer, usually silicon dioxide. The regions are formed by the diffusion of impurities through these apertures. The formation of the source and drain regions defines an additional region therebetween, which is referred to herein as the channel region. The active areas of the channel region underlie a gate and interconnect the source region to the drain region. The gate is a strip of a conductive material such as a metal or highly doped polycrystalline silicon. The gate is deposited on top of an oxide above the channel region and bilaterally overlies the channel region in order to align itself inbetween the source region and the drain region.

In the usual manufacture of the device, the apertures in the silicon oxide for formation of the source and the drain expose in addition to the principal surface of the silicon mesa one or more of the sidewalls of the silicon mesa. These apertures may expose a sidewall traversed by the channel oxide and the corresponding gate. When this occurs, a diffusion of the impurities for the source and the drain extends laterally from the respective sources and drains formed on the principal surface of the silicon mesa to the aforementioned sidewall. Thus, a source and a drain are formed, in addition, on the sidewall. The additional source and drain are referred to herein as the edge source and edge drain. In operation, the edge source and the edge drain have an adverse effect upon the current-voltage characteristic of the transistor.

The current-voltage characteristic of a transistor with an additional edge device comprised of an edge source, an edge drain separated by a gate and gate oxide and corresponding channel traversing the edge or sidewall has a distinctly flattened characteristic, whereas such a transistor with the edge device eliminated has a distinct turn-on voltage. In addition, the transistor device with an edge junction exhibits current voltage hysteresis whereas the "edgeless" device does not. When a voltage is applied to the gate of the edge device, it turns on prior to the device formed on the principal surface of the silicon island, i.e., the "surface" device and creates the aforementioned spread or flatness in the current voltage characteristic of the transistor as well as the aforementioned hysteresis effect. The spread in the current-voltage characteristic is manifested as an unstable turn-on voltage. The extent of the hysteresis is also unstable and unpredictable. Accordingly, it is desirable that these instabilities be eliminated.

Reference is made to the following drawings wherein:

FIG. 1 is a graphic view of a surface transistor and its associated edge transistor;

FIG. 2 is a circuit schematic of the surface transistor in combination with the edge device;

Figure 4:
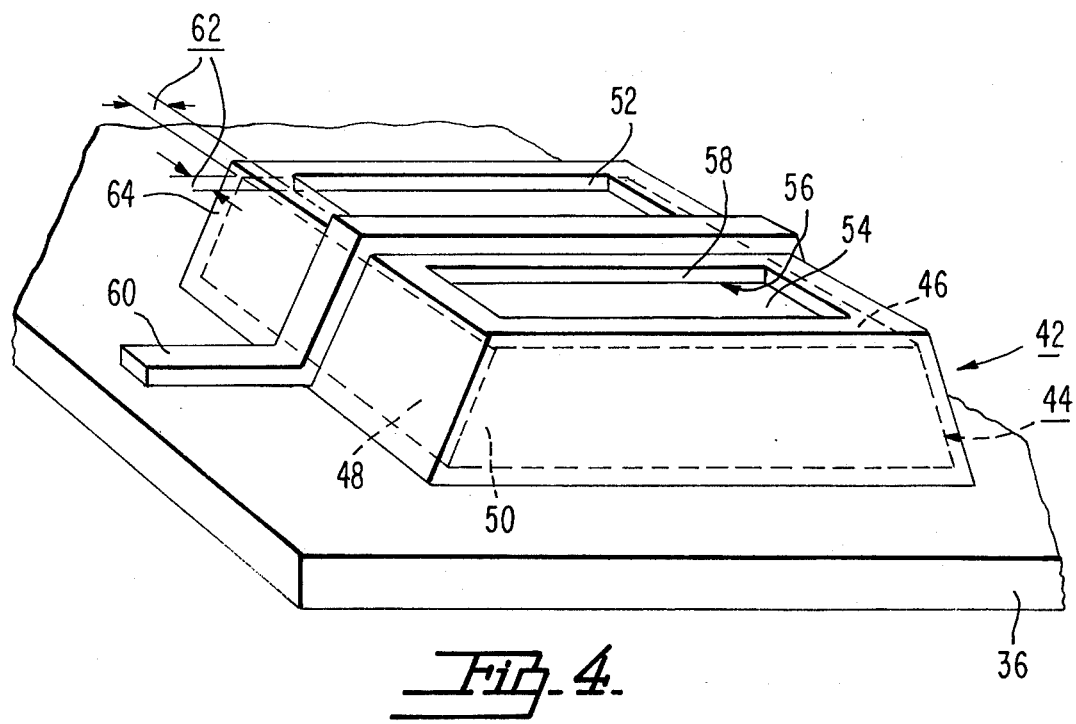
Figure 5:
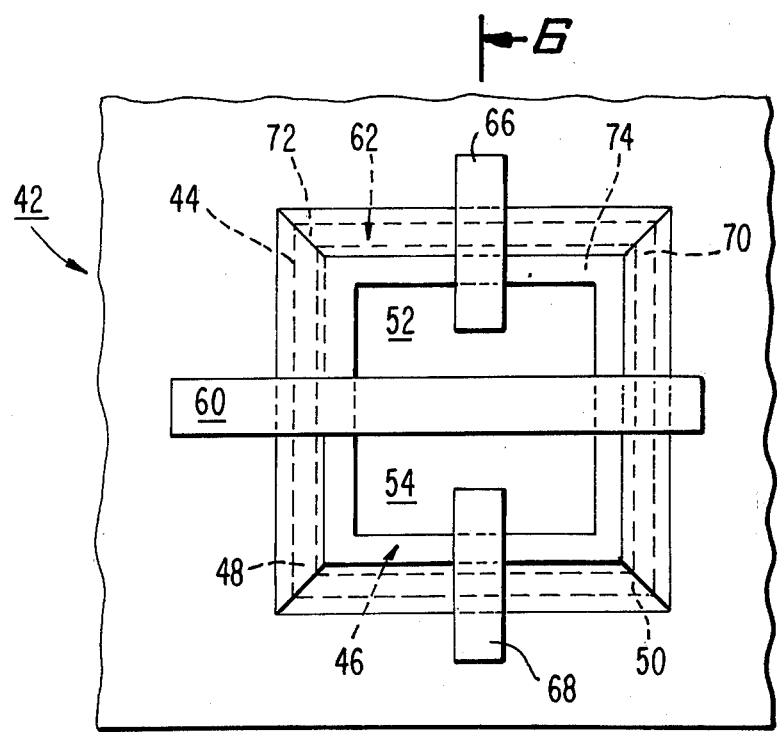
Figure 6:
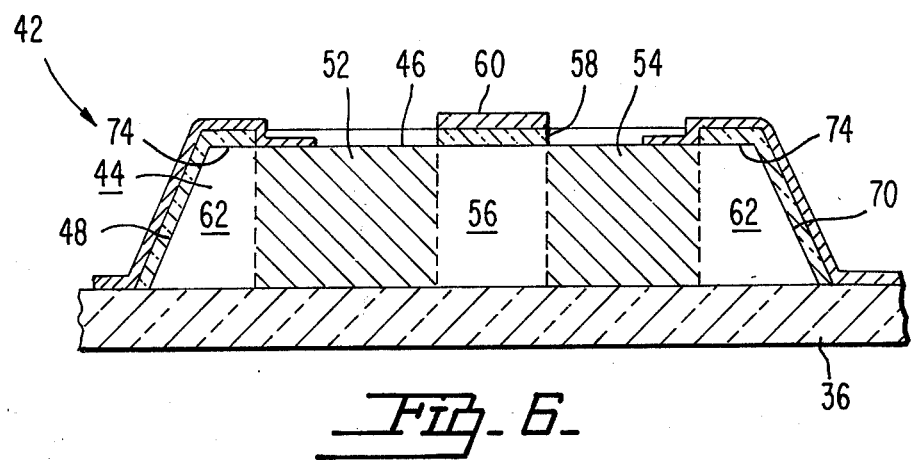

FIG. 3 exhibits the current-voltage characteristic of a transistor with and without an edge junction;

FIG. 4 is a perspective view of the preferred embodiment of the invention;

FIG. 5 is a top view of the device of FIG. 4 with source and drain contacts shown; and FIG. 6 is a cross-section of the device of FIG. 5 along the 6—6 plane.

The concept embodied in the present invention is the isolation of edge junctions formed on the sidewalls of the mesa transistor by interposing between the source and the adjacent sidewall a band of silicon undoped by the source diffusion and by interposing between the drain and its adjacent sidewall a similar band of semiconductor material of the mesa which is not doped by the drain diffusion.

Briefly, the purpose of this concept may be understood by first referring to FIG. 1 wherein there is shown a mesa device 14 comprised of a surface transistor 16 adjacent an edge transistor 18. Diffusion of the source 20 and drain 22 for the surface device 16 creates an edge source 24 and an edge drain 26, respectively. The source 24 and the drain 26 are separated by a channel 28 which is an extension of the channel 30 for the surface device 16. A voltage on a gate (not shown) above the channels 28 and 30 turns on both transistors. However, the edge transistor turns on first because of a lower threshold voltage. Schematically, the device may be represented as shown in FIG. 2.

In FIG. 2, the device 14 is schematically illustrated as two transistors 16 and 18 having common sources and drains and a singular gate input 20. This circuit, which represents the device 14, exhibits a current-voltage characteristic 32 as shown by the solid dark lines in FIG. 3. When the edge device 12 is eliminated physically from the transistor 14 of FIG. 1 or correspondingly when the transistor 18 is eliminated from the schematic of FIG. 2, the edgeless transistor current-voltage behavior exhibits the characteristic 34 shown in FIG. 3 by the dotted lines. The current-voltage characteristic 32 exhibits hysteresis in the present example over the gate voltage from 0 to slightly beyond +2 V. Actually, in the case of the current-voltage characteristic 32, the edge device turns on any where between −0.2 V and 0.0 V. For the edgeless current-voltage characteristic 34, the turn-on voltage is approximately 1.3 V and is repeatable. Thus, the present invention is a new and novel device which provides a stable current-voltage characteristic such as shown at 34.

In FIG. 4 is shown a preferred embodiment of the present novel invention comprising an MOS transistor 42 or an insulating or dielectric substrate 36 comprised of sapphire, for example. The transistor 42 is comprised of a semiconductor mesa 44 of, for example, silicon on a substrate 36 of, for example, sapphire. The mesa 34 has a principal surface 46 surrounded by sidewalls, such as sidewalls 48 and 50. The layer 64 of the insulator extends on to the principal surface of the mesa from the sidewalls 48, 50, 70 and 72. In addition, there is a source 52 and a drain 54 separated by a channel region 56 and overlaid by a gate dielectric 58 and a gate 60. The gate 60 is spaced over the channel by the gate dielectric 58.

A portion of the mesa 44 forms a band 62 which is comprised of the semiconductor material of the mesa undoped by the diffusions which formed the source 52 and drain 54. The band 62 surrounds a central region comprised of the source 52, the drain 54, and the channel region 56 so as to isolate electrically and physically the source 52 and the drain 54 from the encircling sidewalls, such as sidewalls 48 and 50, of the mesa 44. The band 62 is located between the central region and the encircling sidewalls. In the present embodiment, the encircling sidewalls comprise the external surface for the band 62. The external surface of the band 62 is covered by a layer 64 of an insulator, i.e., a dielectric of, for example, silicon dioxide.

Referring now to FIG. 5, there is shown a top view of the device of FIG. 4 with a source contact 66 and a drain contact 68 added. The band 62 is bounded by the substrate 46, the sidewalls 48, 50, 70, 72, and a portion 74 of the principal surface 46 of the mesa 44 which is interposed around the source 52 and the drain 54 and adjacent the sidewalls 48, 50, 70, and 72. The gate 60 traverses the sidewalls 48 and 70 as in prior art devices, however the semiconductor band 62 electrically isolates an edge device formed on either sidewall 48 or 70 from the surface device as comprised of source 52 and drain 54.

A cross-section of the device is shown in FIG. 6 taken along the 6—6 plane of FIG. 5. There is a cross-section of the semiconductor band 62 as it is formed from the semiconductor mesa 44. The band 62 effectively isolates the source 52 from the sidewall 48 as well as the drain 54 from the sidewall 70. The band 62 is bounded at the top by a portion 74 of the principal surface 46 of the mesa 44. The portion 74 may have a width which ranges from 0.1 $\mu$m to 3.0 $\mu$m. Typically, the band 62 has a cross-sectional area of approximately 6.25 square micrometers. The gate 60 may be comprised of a conductor such as, for example, aluminum or highly doped polycrystalline silicon. The channel oxide 58 overlies the channel 56 and in particular embodiments may define the channel 56 upon diffusion of the impurities for the source 52 and the drain 54.

I claim:

1. A transistor comprising a semiconductor mesa with a principal surface, the surface having a region thereunder, sidewalls surrounding the region, a source, a drain, a channel consisting of the semiconductor between the source and the drain, separating the source from the drain, said source and said drain being portions of said region containing doping in addition to the doping in the remainder of said region, a dielectric on the principal surface adjacent the channel, a gate electrode spaced above the channel by the dielectric, and a portion of the mesa undoped by source and drain additional doping containing only impurities of a single type located between the sidewalls and the region, separating the sidewalls from the region and any junctions between the source and channel and between the drain and the channel, the region comprising the source, the drain, and the channel, the portion comprising a band of the semiconductor, the band encircling the region.

2. The transistor of claim 1, wherein the dielectric traverses a sloping sidewall.

3. The transistor of claim 2 wherein the gate electrode traverses the sloping sidewall.

4. The transistor of claim 3, further comprising a dielectric substrate, the substrate supporting the mesa.

5. The transistor of claim 4, wherein the surface is the principal surface of the mesa and wherein the sidewall is a sloping sidewall of the mesa.

6. The transistor of claim 5, wherein the mesa is comprised of silicon and wherein the substrate is comprised of sapphire.

7. The transistor of claim 6, wherein the dielectric is an oxide of silicon.

8. The transistor of claim 7, wherein the gate electrode is either aluminum or highly doped polycrystalline silicon.

9. The transistor of claim 8, further comprising a layer of an oxide of silicon completely covering the sidewall.

10. The transistor of claim 9, wherein the layer extends onto the principal surface from the sidewall.

* * * * *